United States Patent
Roh et al.

(10) Patent No.: US 9,171,739 B1
(45) Date of Patent: Oct. 27, 2015

(54) INTEGRATED CIRCUIT PACKAGING SYSTEM WITH CORELESS SUBSTRATE AND METHOD OF MANUFACTURE THEREOF

(71) Applicants: YoungDal Roh, Icheon-si (KR); DeokKyung Yang, Hanam-si (KR); HeeSoo Lee, Anyang-si (KR)

(72) Inventors: YoungDal Roh, Icheon-si (KR); DeokKyung Yang, Hanam-si (KR); HeeSoo Lee, Anyang-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 14/313,452

(22) Filed: Jun. 24, 2014

(51) Int. Cl.
  *H01L 23/28* (2006.01)
  *H01L 21/44* (2006.01)
  *H01L 21/48* (2006.01)
  *H01L 23/495* (2006.01)
  *H01L 23/00* (2006.01)

(52) U.S. Cl.
  CPC .......... *H01L 21/4825* (2013.01); *H01L 23/495* (2013.01); *H01L 24/33* (2013.01); *H01L 24/83* (2013.01)

(58) Field of Classification Search
  CPC ................................. H01L 24/33; H01L 24/83
  USPC .................. 257/787, 774, E23.116, E21.502; 438/127, 667
  See application file for complete search history.

(56) References Cited

U.S. PATENT DOCUMENTS

| | | | | |
|---|---|---|---|---|
| 6,943,058 | B2* | 9/2005 | Chaudhuri et al. | 438/108 |
| 7,152,314 | B2* | 12/2006 | Shuto et al. | 29/830 |
| 7,543,374 | B2* | 6/2009 | Nakamura | 29/846 |
| 7,705,472 | B2* | 4/2010 | Mahler et al. | 257/783 |
| 8,258,624 | B2* | 9/2012 | Beer et al. | 257/737 |
| 8,536,715 | B2* | 9/2013 | Chino | 257/778 |
| 8,569,892 | B2* | 10/2013 | Mori et al. | 257/774 |
| 8,581,421 | B2* | 11/2013 | Shimizu et al. | 257/784 |
| 8,686,300 | B2 | 4/2014 | Kawai et al. | |
| 2005/0155222 | A1* | 7/2005 | Nakamura | 29/830 |
| 2011/0095410 | A1* | 4/2011 | Gomez | 257/676 |
| 2011/0304016 | A1* | 12/2011 | Nakamura et al. | 257/532 |
| 2012/0319304 | A1* | 12/2012 | Pressel et al. | 257/787 |
| 2013/0264724 | A1* | 10/2013 | Telgenbuscher et al. | 257/787 |
| 2013/0313004 | A1 | 11/2013 | An et al. | |

FOREIGN PATENT DOCUMENTS

EP    1274288 A1    8/2003

* cited by examiner

*Primary Examiner* — Nitin Parekh
(74) *Attorney, Agent, or Firm* — Ishimaru & Associates LLP

(57) ABSTRACT

An integrated circuit packaging system, and a method of manufacture thereof, including: a patterned first conductive plating; a molding on the patterned first conductive plating; a through via through the molding; a second conductive plating on the molding and the through via; a protection layer partially covering the first conductive plating, the second conductive plating and the molding; a device on the first conductive plating; and an external connector being attached to the second conductive plating.

20 Claims, 10 Drawing Sheets

INTEGRATED CIRCUIT PACKAGING SYSTEM WITH CORELESS SUBSTRATE AND METHOD OF MANUFACTURE THEREOF

TECHNICAL FIELD

The present invention relates generally to an integrated circuit packaging system, and more particularly to a system with a coreless Embedded Trace Substrate (ETS).

BACKGROUND ART

Semiconductor chips have become progressively more complex, driven in large part by the need for increasing processing power in a smaller chip size for compact or portable electronic devices such as cell phones, smart phones, personal media systems, or ultraportable computers.

The semiconductor chips are packaged in integrated circuit packaging systems. Most of the integrated circuit packaging systems are made by placing the semiconductor chips on a lead frame; wire bonding the chips to the metal leads of that lead frame; and then protecting the chips with encapsulation.

Leadframe technology is widely used in many package varieties that use metal leads extending outside the package housing. Conventional integrated circuit packaging manufacture uses costly materials for leadframe, such as core and pre-preg, and build-up processes, which are costly and have long cycle times and involves more process controls.

Thus, a need still remains for a precise and cost-effective way of creating leadframes. In view of the shrinking sizes of electronic components, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method (3200) of manufacture of an integrated circuit packaging system (100) that includes forming a patterned first conductive plating (206); forming a molding (202) on the patterned first conductive plating (206); forming a through via (210) through the molding (202); forming a second conductive plating (208) on the molding (202) and the through via (210); forming a protection layer (106) partially covering the first conductive plating (206), the second conductive plating (208) and the molding (202); and mounting a device (102) on the first conductive plating (206).

The present invention provides an integrated circuit packaging system (100) that includes a patterned first conductive plating (206); a molding (202) on the patterned first conductive plating (206); a through via (210) through the molding (202); a second conductive plating (208) on the molding (202) and the through via (210); a protection layer (106) partially covering the first conductive plating (206), the second conductive plating (208) and the molding (202); a device (102) on the first conductive plating (206); and an external connector (3008) being attached to the second conductive plating (208).

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
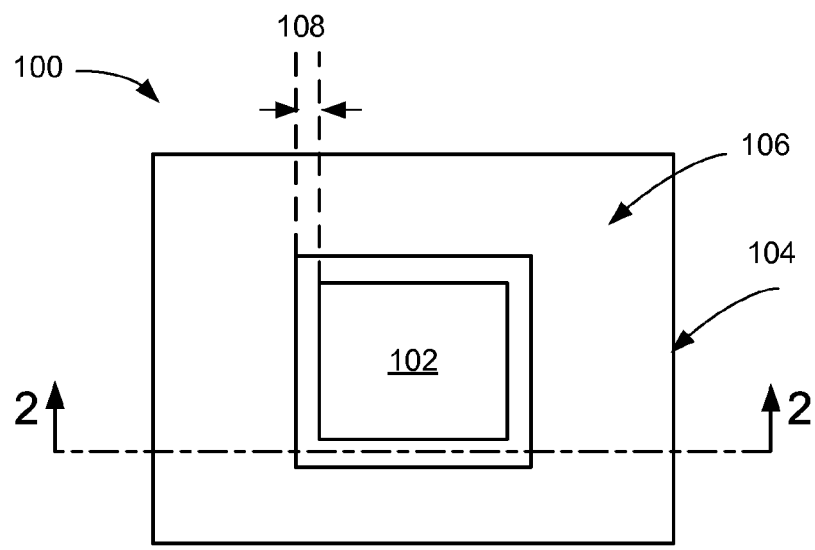
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the active side of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure.

The term "processing" as used herein includes deposition of material or photoresist, patterning, exposure, development, etching, cleaning, and/or removal of the material or photoresist as required in forming a described structure.

Wavy lines are used throughout the figures to show that only a portion of the full structure is being shown. Portions of the structures and components are omitted for simplicity and clarity.

In current semiconductor packaging manufacturing industry, it is a challenge to reduce the manufacturing cost. Since a substrate is an essential and the biggest part of the packaging system, the cost of manufacturing the substrate is the greatest of the cost of manufacturing the packaging system. In order to reduce the overall cost of semiconductor packaging manufacturing, reducing the cost of manufacturing the substrate is critical.

Conventional semiconductor packaging system uses costly materials including core and pre-preg, which require more complicated processes including laser via drilling, seed layer deposing, dry film patterning, plating, and etching seed layer. The embodiments of the invention challenge to replace the costly materials and simplify the complicated processes.

One solution is using Molded Interconnect Substrate (MIS) to replace the conventional substrate materials. MIS uses Epoxy Mold Compound (EMC) to replace Laser Direct Structuring (LDS) material or polytetraflurorethylene pre-impregnated (PPG). Since the MIS is about 20% cheaper than general substrate, the cost of the substrate is reduced about 20% or more when use MIS. However, the manufacturing of MIS involves more steps and is more complicated to control than LDS.

The LDS material cost is more expensive than EMC, because there is a laser activated material included. LDS is one of the technology for molded interconnect device application. The metallorganic in polymer of LDS material is changed to metal particles by laser radiation and acting as a seed layer. This character of the LDS can omit the seed layer and reduce the process steps and cost. Thermoplastic LDS materials commercialized with injection molding and thermosetting LDS materials in progress of development. Besides injection molding for LDS encapsulation, various process options may be available such as transfer molding, coating, printing, or lamination. However when using LDS, the packaging manufacturing process can omit some steps including seed layer deposing and etching seed layer process. Consequently, the whole substrate manufacturing cost goes down even though the LDS material costs more than EMC or polytetraflurorethylene pre-impregnated (PPG).

A coreless Embedded Trace Substrate (ETS) is emerging as low-cost solution. Not only it has good reliability due to preventing bump bridge, but also it can reduce the cost due to using dual process and coreless substrate.

The embodiments of the invention are related to the manufacturing of a package substrate, especially a coreless ETS. In order to save manufacturing cost, polytetraflurorethylene pre-impregnated (PPG) lamination process is replaced with a molding process, as well as a LDS material is utilized to save the cost. The combination of coreless ETS and MIS further reduces the substrate manufacturing cost and improves reliability. In addition, a coreless ETS having Dry Film (D/F) concept is introduced in the invention to further reduce the manufacturing cost.

Referring now to FIG. 1, therein is shown a top view of an integrated circuit packaging system 100 in a first embodiment of the present invention. The integrated circuit packaging system 100 includes a device 102, such as an integrated circuit die or a flip chip, mounted on a substrate 104 surrounded by a protection layer 106, such as a solder resist layer.

The device 102 is electrically connected with the substrate 104 through built-in conductive vias and platings of the substrate 104. The protection layer 106 covers a peripheral of a top surface of the substrate 104, wherein the protection layer 106 can be a dielectric material insulating the conductive area of the substrate 104 from unwanted circuit shorting, and protecting the top surface of the substrate 104 from physical, electrical, moisture, and/or chemical damages. The device 102 is mounted in a cavity on the top surface of the substrate 104 uncovered and surrounded by the protection layer 106. A gap 108 is between the outer vertical sidewalls of the device 102 and the inner vertical sidewalls of the protection layer 106.

Figure 2:
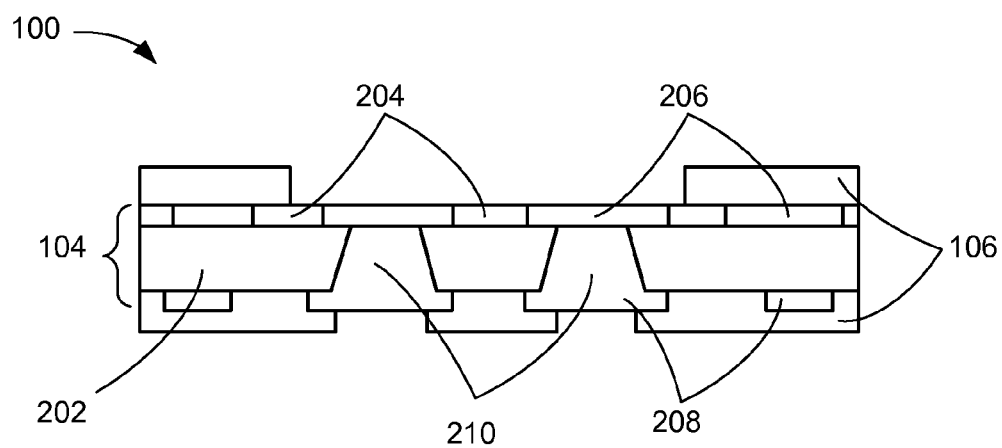
FIG. 2 is a cross-sectional view of FIG. 1 along the section line 2-2 of FIG. 1.

Referring now to FIG. 2, therein is shown a cross-sectional view of FIG. 1 along the section line 2-2 of FIG. 1. This view shows the substrate 104 includes an Epoxy Mold Compound (EMC) 202, an embedded photo resist 204, a first conductive plating 206, a second conductive plating 208, and a through via 210. The protection layer 106 covers the peripheral of the top surface of the substrate 104 including some of the first conductive plating 206 and the embedded photo resist 204.

The substrate 104 can comprise multiple layers. The EMC 202 is the middle layer of the substrate 104 formed by molding process. The EMC 202 is a low cost material replacing costly conventional substrate materials. The embedded photo resist 204, such as dry film, is patterned and deposited on a top surface of the EMC 202. The embedded photo resist 204 protects the top surface of the EMC 202 and provides insulations among the first conductive plating 206. The first conductive plating 206 is surrounded by the embedded photo resist 204. The second conductive plating 208 is patterned and attached on the through via 210 and a bottom surface of the EMC 202.

The through via 210 is through the EMC 202, exposed at the top and bottom surfaces of the EMC 202. The through via 210 is formed with conductive materials, usually the same material of the first conductive plating 206 and the second conductive plating 208, such as copper (Cu) or alloy thereof. The first conductive plating 206 and the second conductive plating 208 are coupled with the through via 210 electrically connecting the top surface and the bottom surface of the substrate 104.

The protection layer 106, such as solder resist, is formed on the peripheral of the top surface of the substrate 104, having a cavity in the middle. The cavity on the top surface of the substrate 104, surrounded by the protection layer 106 is the mounting surface of the integrated circuit packaging system 100 for mounting the device 102. The protection layer 106 can be formed on the bottom surface of the substrate 104, covering the EMC surfaces and the some of the second conductive plating 208, exposing the center of the second conductive plating 208 which are coupled with the through via 210 or other conductive paths.

Figure 3:
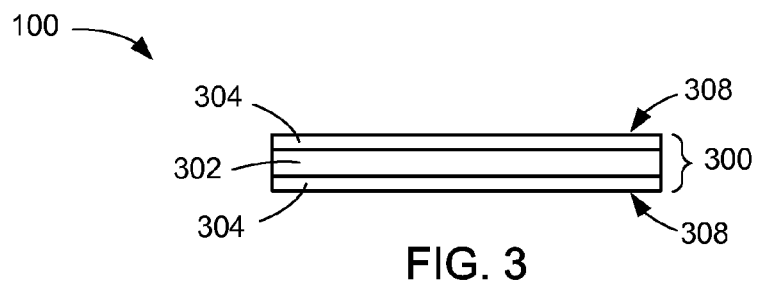
FIG. 3 is a carrier in carrier preparing phase of manufacture of the integrated circuit packaging system of FIG. 1.

Referring now to FIG. 3, therein is shown a carrier 300 in carrier preparing phase of manufacture of the integrated circuit packaging system 100 of FIG. 1. The carrier 300 can include a detach core 302 and conductive foils 304. The conductive foils 304 are made of conductive materials, such as copper or alloy thereof, are in direct contact with top and bottom surfaces of the detach core 302. The carrier 300 has foil surfaces 308 on the conductive foils 304. The detach core 302 can be made of detachable materials that are easy to be detached from the conductive foils 304 at the end of the manufacturing process and can minimize damages.

The carrier 300 is prepared to transport uncompleted substrates during the manufacturing processes. Materials needed in the upcoming manufacturing process are attached to the carrier 300. The carrier 300 and the materials attached thereon are transported to processing facilities. The substrate 104 of FIG. 1 is detached from the carrier 300 when the entire manufacturing process is completed. The conductive foils 304 are the bases of constructing two of the substrate 104, one on top of the carrier 300, one under bottom of the carrier 300. Two of the substrate 104 can be manufactured simultaneously.

It has been discovered that, utilizing a dual process to manufacture two of the substrate 104 simultaneously, can double the productivity and further reduce manufacturing cost.

The structure on top of the carrier 300 is mirrored with the structure under the bottom of the carrier 300, as a matter of descriptive convenience, the structure on the top of the carrier 300 is described in the embodiment of the invention, while the structure under the bottom is same but mirrored.

Figure 4:
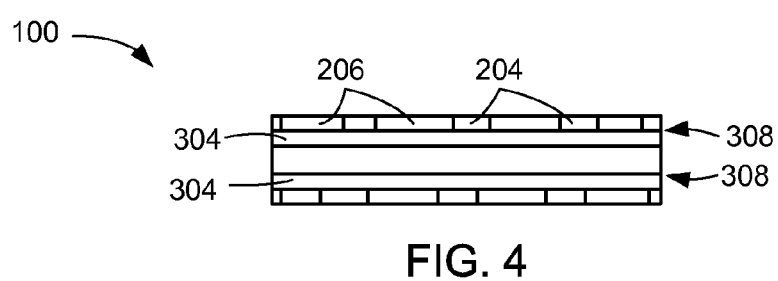
FIG. 4 is the structure of FIG. 3 after first metal layer patterning phase of manufacture.

Referring now to FIG. 4, therein is shown the structure of FIG. 3 after first metal layer patterning phase of manufacture. During this process, the embedded photo resist 204 is patterned and deposited on the foil surface 308 of the conductive foils 304. A conductive material, such as copper or alloy thereof, is deposited on the uncovered foil surface 308 isolated by the embedded photo resist 204, to form the first conductive plating 206 in plating process. The first conductive plating 206 can be formed with same conductive materials as the conductive foils 304.

The embedded photo resist 204 is patterned to expose some carrier surfaces for depositing the first conductive plating 206. Surfaces of the first conductive plating 206 are aligned with surfaces of the embedded photo resist 204. The foil surface 308 is covered with the embedded photo resist 204 and first conductive plating 206 completely. The surfaces of the first conductive plating 206 and the embedded photo resist 204 are coplanar with the foil surface 308.

Figure 5:
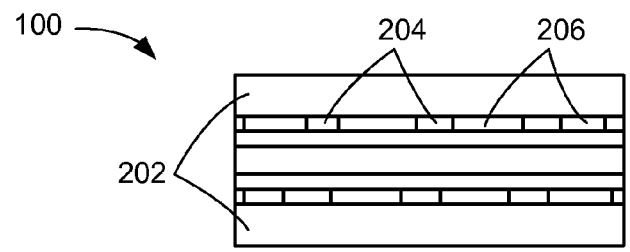
FIG. 5 is the structure of FIG. 4 after molding process phase of manufacture.

Referring now to FIG. 5, therein is shown the structure of FIG. 4 after molding process phase of manufacture. This structure shows a molding, such as the EMC 202 is in directly contact with the embedded photo resist 204 and the first conductive plating 206 in the molding process. The first conductive plating 206 is isolated by the embedded photo resist 204. The surface of the EMC 202 is coplanar with the foil surface 308 of FIG. 3.

Optionally, the EMC 202 can be replaced with a Laser Direct Structuring (LDS) material, while the process can be replaced with a LDS process. By using the molding process to replace polytetraflurorethylene pre-impregnated (PPG) laminated process, the manufacturing process is simplified and the cost is reduced.

Figure 6:
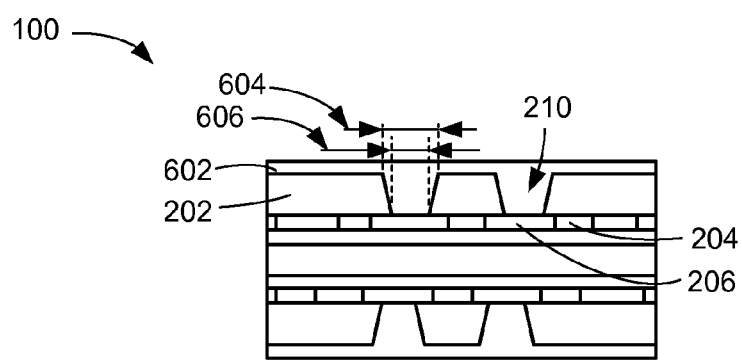
FIG. 6 is the structure of FIG. 5 after via drilling and plating process phase of manufacture.

Referring now to FIG. 6, therein is shown the structure of FIG. 5 after via drilling and plating process phase of manufacture. In the laser drill process, the EMC 202 is drilled through to form a plurality of through holes. Conductive materials fill the through holes and deposit on top surface of the EMC 202, to form the through vias 210 and a second conductive layers 602.

The through vias 210 can have wider opens 604 at the second conductive layers 602, and narrower opens 606 at the first conductive plating 206. The narrower opens 606 occupy less surface space of the EMC 202, enabling more of the first conductive plating 206 can be configured on the bottom surface of the EMC 202 for fine pitch. The wider opens 604 and the narrower opens 606 at each end of the through via 210 are centered with each other, and aligned with the top surface and bottom surface of the EMC 202 respectively. The first conductive plating 206 is electrically connected to the second conductive layer 602 through the through via 210.

Figure 7:
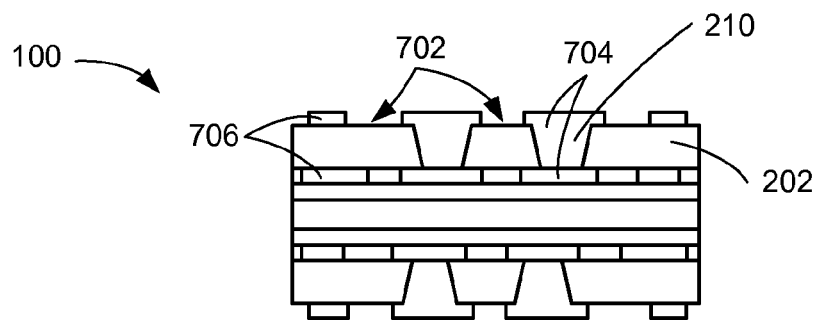
FIG. 7 is the structure of FIG. 6 after second metal layer patterning process phase of manufacture.

Referring now to FIG. 7, therein is shown the structure of FIG. 6 after second metal layer patterning process phase of manufacture. The second conductive layers 602 of FIG. 6 are patterned and etched through to expose EMC surfaces. Exposed EMC surfaces 702 isolate the preserved portion of the second conductive layers 602 in the patterning process. The preserved portion of the second conductive layers 602 are the second conductive plating 208 of FIG. 2. The first conductive plating 206 of FIG. 6 and the second conductive plating 208 coupled to the through via 210 are defined as through via caps 704. The first conductive plating 206 and the second conductive plating 208 on the EMC 202 are defined as conductive plating 706.

The through via caps 704 are attached directly on each side of the through via 210, having a perimeter greater than the opening of the through via 210. The through via caps 704 are centered with the through vias 210 attached thereto and extended on edges of the EMC 202. The overlap of the through via caps 704 and the EMC 202 can secure the connection of the through vias 210 and prevent unwanted circuit short or misalignment.

The conductive plating 706, the through via 210 and the through via caps 704 can be configured on desired locations with plurality sizes and shapes, and can be connected to devices or external connectors.

Figure 8:
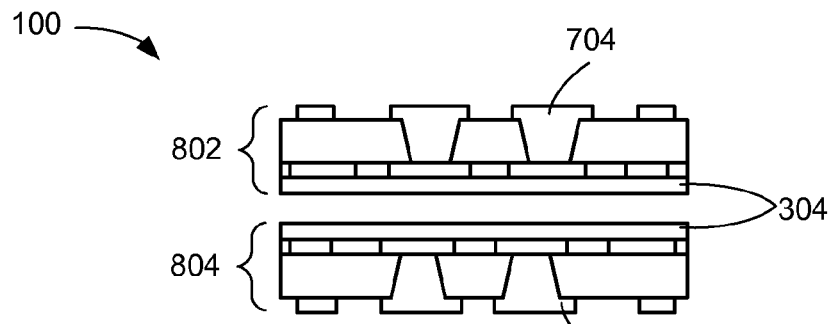
FIG. 8 is the structure of FIG. 7 after detaching process phase of manufacture.

Referring now to FIG. 8, therein is shown the structure of FIG. 7 after detaching process phase of manufacture. In the detaching process, the detach core 302 of FIG. 3 is removed. A top structure 802 and bottom structure 804 are separated as individual structures. The top structure 802 and bottom structure 804 are identical multiple layer substrates mirrored in FIG. 8. For example, the through via caps 704 on the wider opens 604 of FIG. 6 of the top structure 802 is the through via caps 704 on the wider opens 604 of the bottom structure 804.

With a dual process, two identical substrates 104 can be manufactured simultaneously.

Figure 9:
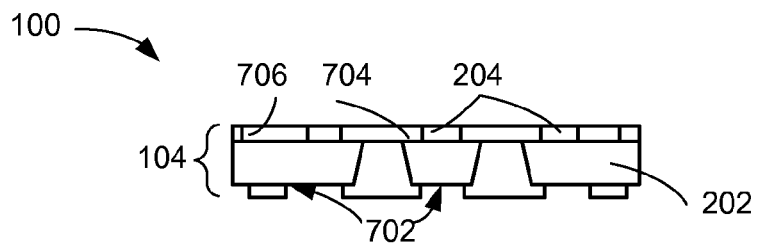
FIG. 9 is the bottom structure of FIG. 8 after conductive foil etching phase of manufacture.

Referring now to FIG. 9, therein is shown the bottom structure 804 of FIG. 8 after conductive foil etching phase of manufacture. The conductive foil 304 of FIG. 8 is etched off, exposing the embedded photo resist 204 and the adjacent conductive plating 706 and the through via caps 704. The EMC 202 has the exposed EMC surfaces 702 opposite of the embedded photo resist 204.

Figure 10:
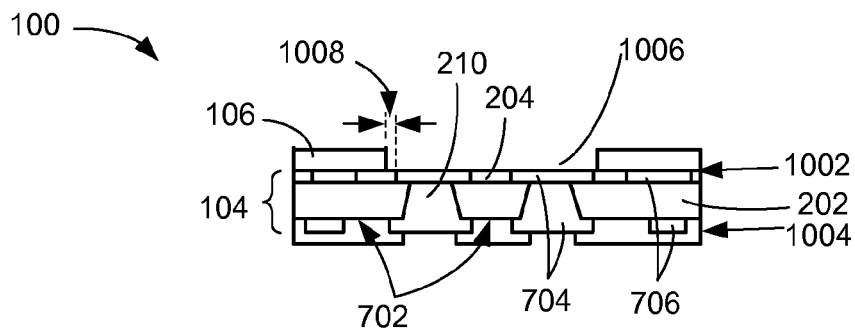
FIG. 10 is the structure of FIG. 9 in protection layer depositing process phase of manufacture.

Referring now to FIG. 10, therein is shown the structure of FIG. 9 after protection layer depositing process phase of manufacture. The protection layer 106 is deposited on a peripheral of a substrate top surface 1002. The protection layer 106 is deposited on a substrate bottom surface 1004 covering the exposed EMC surfaces 702 and the conductive plating 706.

The protection layer 106 covers the peripheral of the substrate top surface 1002 exposing a center cavity 1006. The through via caps 704 on the narrower opens 606 of FIG. 6 and the adjacent embedded photo resist 204 are exposed in the center cavity 1006. A gap 1008 exists between the inner vertical edge of the protection layer 106 and the edge of the most adjacent through via cap 704 exposed in the center cavity 1006. The conductive plating 706 on the substrate top surface 1002 is buried under the protection layer 106 and embedded in the embedded photo resist 204. The top surface of the protection layer 106 is coplanar with the substrate top surface 1002.

The protection layer 106 covers the conductive plating 706 and the exposed EMC surfaces 702 at the substrate bottom surface 1004, extending over the edge of the through via caps 704 on the wider opens 604 of FIG. 6. The center of the through via caps 706 at the substrate bottom surface 1004 are exposed from the protection layer 106. The bottom surface of the protection layer 106 is coplanar with the substrate bottom surface 1004.

The through vias 210 and the through via caps 704 are coupled with each other providing electrical paths connecting the substrate top surface 1002 and the substrate bottom surface 1004. The embedded photo resist 204 provides insulation around the through via caps 704 and the conductive plating 706. The protection layer 106 protects the surfaces of the substrate 104 from physical or chemical wears and damages. Usually, the same conductive materials are used to form the conductive plating 706, the through via caps 704 and the through via 210 to reduce resistant, however, different conductive metal and alloy thereof can be used as well.

It has been discovered that by using EMC in a substrate, the material cost of manufacturing a substrate has been reduced since the EMC costs less than the conventional substrate materials. By using EMC with a molding process instead of PPG lamination process, the cost of manufacturing the substrate is further reduced.

Figure 11:
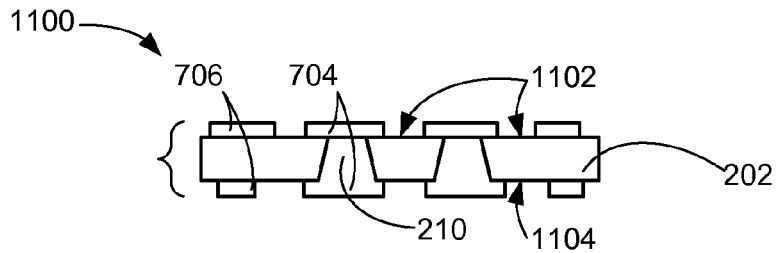
FIG. 11 is the structure of FIG. 9 of a circuit packaging system after photo resist stripping process phase of manufacture in a second embodiment of the present invention.

Referring now to FIG. 11, therein is shown the structure of FIG. 9 of a circuit packaging system 1100 after photo resist stripping process phase of manufacture in a second embodiment of the present invention. The embedded photo resist 204 of FIG. 9 is removed from the substrate 104 of FIG. 9. The through via caps 704 are coupled on narrower and wider ends of the through vias 210. The conductive plating 706 can be on the peripheral of top and bottom surfaces of the EMC 202. Exposed EMC top surfaces 1102 and exposed EMC bottom surfaces 1104 isolate the conductive plating 706 and the through via caps 704. The surfaces of the through via caps 704 are aligned with the conductive plating 706 and coplanar with the surfaces of the EMC 202.

Figure 12:
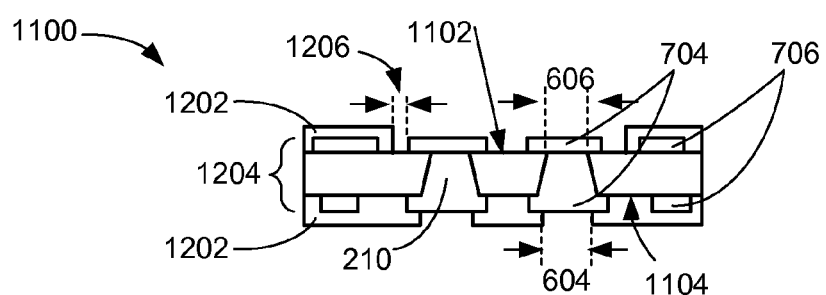
FIG. 12 is the structure of FIG. 11 in the protection layer depositing process phase of manufacture.

Referring now to FIG. 12, therein is shown the structure of FIG. 11 in the protection layer depositing process phase of manufacture. A protection layer 1202 is deposited on top and bottom surfaces of a substrate 1204. The protection layer 1202 covers the bottom of the substrate 1204 exposing the center of the through via caps 704, and the peripheral of top of the substrate 1204.

The protection layer 1202 covers the peripheral of the top of the substrate 1204, exposing the center area thereof. The through via caps 704 on the narrower opens 606 and the adjacent exposed EMC top surfaces 1102 are exposed in the center area. A gap 1206 exists between the inner vertical edge of the protection layer 1202 and the most adjacent vertical edge of the through via caps 704. The conductive plating 706 is buried in the protection layer 1202. The surface of the protection layer 1202 is higher than the surfaces of the through via caps 704 and the conductive plating 706.

The protection layer 1202 cover the exposed EMC bottom surface 1104 and the conductive plating 706, extending over the edge of the through via caps 704 and exposing the center of the through via caps 704 on the wider opens 604. The surface of the protection layer 1202 is higher than the surfaces of the through via caps 704, and the conductive plating 706. The conductive plating 706 is buried in the protection layer 1202.

The through vias 210 and the through via caps 704 are coupled with each other provide electrical paths connecting top and bottom sides of the substrate 1204. The protection layer 1202 protects the surfaces of the substrate 1204 from physical and chemical damages and wears.

Figure 13:
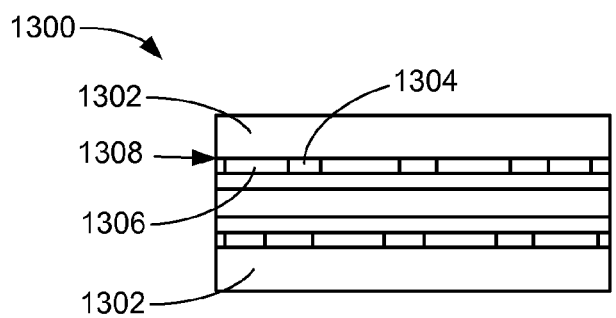
FIG. 13 is the structure of FIG. 4 after molding process phase of manufacture of an integrated circuit packaging system in a third embodiment of the invention.

Referring now to FIG. 13, therein is shown the structure of FIG. 4 after molding process phase of manufacture of an integrated circuit packaging system 1300 in a third embodiment of the invention. This structure shows a LDS material 1302 is formed covering an embedded photo resist 1304, such as dry film, and a first conductive plating 1306, such as copper or copper alloy in the molding process. The LDS material 1302 is in direct contact with the embedded photo resist 1304 and the first conductive plating 1306, having contacting surfaces 1308. The first conductive plating 1306 are embedded in the embedded photo resist 1304. The first conductive plating 1306 are formed with conductive materials to provide electrical connectivity. The surface of the LDS material 1302 is coplanar with the contacting surfaces 1308.

Figure 14:
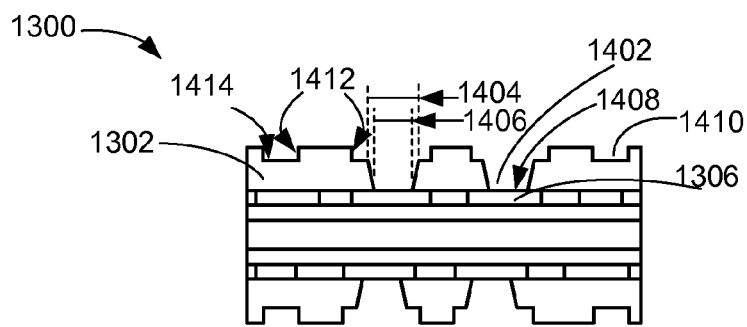
FIG. 14 is the structure of FIG. 13 after via drilling and plating process phase of manufacture.

Referring now to FIG. 14, therein is shown the structure of FIG. 13 after via drilling and plating process phase of manufacture. In a laser drill process, the LDS material 1302 is drilled through to form a plurality of through holes 1402 on the first conductive plating 1306.

The through holes 1402 can have wider opens 1404 and narrower opens 1406. Plating surfaces 1408 are exposed in the narrower opens 1406. Sloping sidewalls of the through holes 1402 are extended from the plating surfaces 1408 toward the wider opens 1404. Plurality of traces 1410 are patterned in top surface of the LDS material 1302 with various dimensions and shapes.

Some of the traces 1410 are patterned in the top surface of the LDS material 1302, having vertical sidewalls 1412 and flat bottoms 1414, wherein the flat bottoms 1414 are higher than the contacting surfaces 1308. Some of the traces 1410 are patterned above the through holes 1402, wherein the flat bottoms 1414 are extended between the wider opens 1404 and the vertical sidewalls 1412. The depths of the traces 1410 in the top surface of the LDS material 1302 and above the through holes 1402 are uniform.

Figure 15:
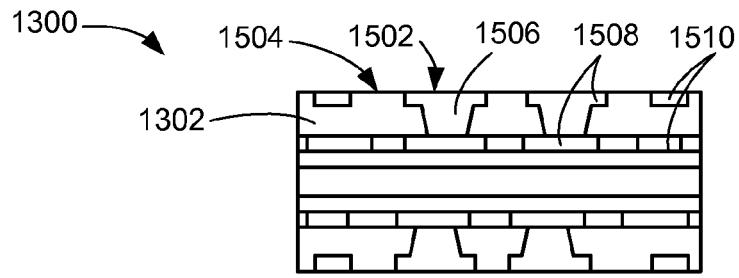
FIG. 15 is the structure of FIG. 14 after second metal layer patterning process phase of manufacture.

Referring now to FIG. 15, therein is shown the structure of FIG. 14 after second metal layer patterning process phase of manufacture. Conductive materials, such as copper or alloy thereof, are filled into the through holes 1402 and traces 1410 of FIG. 14 to form second conductive plating and vias. The second conductive plating has top surfaces 1502 aligned with LDS material top surfaces 1504. Through vias 1506 are defined as the filled conductive materials between the wider opens 1404 and plating surfaces 1408 of FIG. 14. Through via caps 1508 can include the second conductive plating covering the wider opens 1404, shaped by the vertical sidewalls 1412 and the flat bottoms 1414 of the LDS material 1302 of FIG. 14. The through via caps 1508 can also include the first conductive plating 206 of FIG. 4 which are coupled on the narrower opens 1406 of the through vias 1506.

The through via caps 1508 are directly on both ends of the through vias 1506, having perimeters greater than the both ends of the through vias 1506. The through via caps 1508 are centered with the wider opens 1404 and plating surfaces 1408 of the through vias 1506.

Conductive plating 1510 can be defined as the second conductive plating and the first conductive plating 206 not attached to the through vias 1506. The conductive plating 1510 can be embedded in the LDS material 1302, having the vertical sidewalls 1412 and the flat bottoms 1414 directly contacted with the LDS material 1302. The bottom of the conductive plating 1510 does not contact with the through vias 1506. The conductive plating 1510 can also include the first conductive plating 206 below the LDS material 1302 without contacting the through via 1506.

Figure 16:
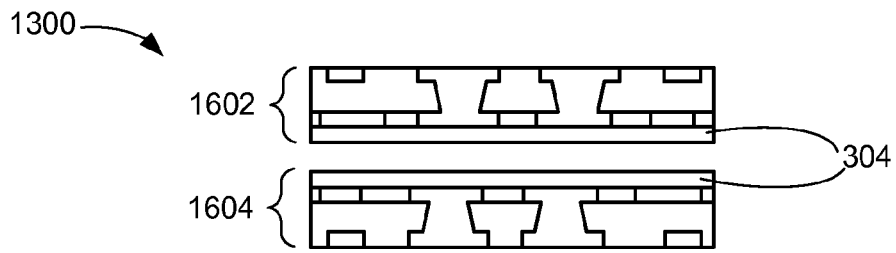
FIG. 16 is the structure of FIG. 15 after the detaching process phase of manufacture.

Referring now to FIG. 16, therein is shown the structure of FIG. 15 after the detaching process phase of manufacture. In the detaching process, the detach core 302 of FIG. 3 is removed. An identical top structure 1602 and bottom structure 1604 are separated as individual structures.

Figure 17:
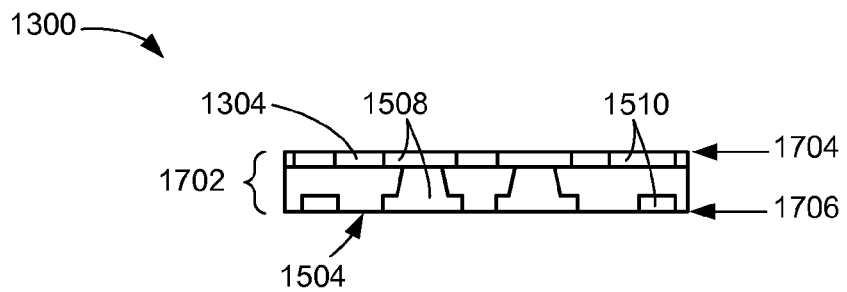
FIG. 17 is the bottom structure of FIG. 16 after conductive foil etching phase of manufacture.

Referring now to FIG. 17, therein is shown the bottom structure 1604 of FIG. 16 after conductive foil etching phase of manufacture. The conductive foil 304 of FIG. 16 is etched off from the bottom structure 1604. The embedded photo resist 1304, the through via caps 1508 at the narrower opens 1406 of FIG. 14, and conductive plating 1510 of a substrate 1702 are exposed on a top substrate surface 1704. The LDS material top surfaces 1504, the through via caps 1508 at the wider opens 1404 of FIG. 14, and conductive plating 1510 are exposed on a bottom substrate surface 1706.

Figure 18:
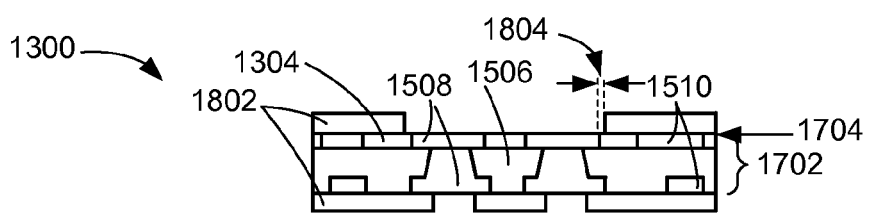
FIG. 18 is the structure of FIG. 17 after protection layer depositing process phase of manufacture.

Referring now to FIG. 18, therein is shown the structure of FIG. 17 after protection layer depositing process phase of manufacture. The protection layer 1802, such as solder resist, is deposited on peripheral of the top substrate surface 1704 and bottom substrate surfaces 1706 of FIG. 17 exposing the through via caps 1508.

The protection layer 1802 covers the peripheral of the top substrate surface 1704, exposing the center area thereof. The through via caps 1508 on the narrower opens 1406 of FIG. 14 and the adjacent embedded photo resist 1304 are exposed in the center area. A gap 1804 exists between the inner vertical edge of the protection layer 1802 and the outer edge of the through via caps 1508. The conductive plating 1510 on the top substrate surface 1704 is buried under the protection layer 1802 and embedded in the embedded photo resist 1304.

The center of the through via caps 1508 on the wider opens 1404 of FIG. 14 are exposed from the protection layer 1802, while the edges of the through via caps 1508 are covered by the protection layer 1802. The exposed LDS material top surfaces 1504 of FIG. 17 and the adjacent conductive plating 1510 are covered by the protection layer 1802.

The surfaces of the protection layer 1802 are coplanar with the through via caps 1508 and the embedded photo resist 1304.

The through vias 1506 and the through via caps 1508 are coupled with each other to provide electrical paths connecting both sides of the substrate 1702. The embedded photo resist 1304 provides insulation around the through via caps 1508 and the conductive plating 1510. The conductive plating 1510 are protected and isolated by the protection layer 1802 from physical and chemical damages and wears.

Figure 19:
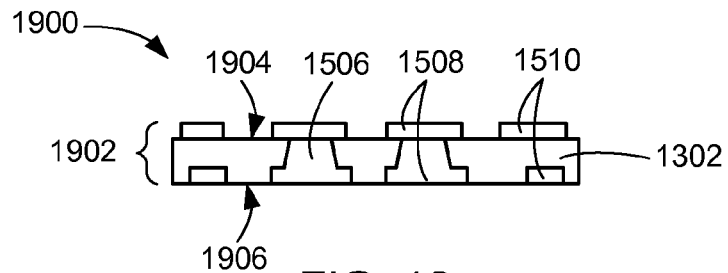
FIG. 19 is the structure of FIG. 17 of a circuit packaging system after photo resist stripping process phase of manufacture in a fourth embodiment of the present invention.

Referring now to FIG. 19, therein is the structure of FIG. 17 of a circuit packaging system 1900 after photo resist stripping process phase of manufacture in a fourth embodiment of the present invention. The embedded photo resist 1304 of FIG. 17 is removed from the substrate 1702 of FIG. 17 to form a substrate 1902. The through via caps 1508 are capped on both ends of the through vias 1506. The conductive plating 1510 are on the peripheral of top surface and embedded in the bottom surface of the LDS material 1302. Exposed LDS material top surfaces 1904 and exposed LDS material bottom surfaces 1906 isolate the conductive plating 1510 and through via caps 1508. The top surfaces of the through via caps 1508 are aligned with the conductive plating 1510.

Figure 20:
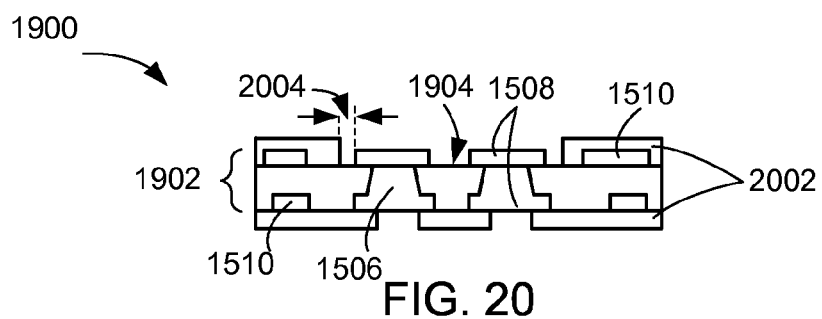
FIG. 20 is the structure of FIG. 19 in the protection layer depositing process phase of manufacture.

Referring now to FIG. 20, therein is shown the structure of FIG. 19 in the protection layer depositing process phase of manufacture. The protection layer 2002 is deposited on top and bottom surfaces of the substrate 1902. The protection layer 2002 covers the exposed LDS material bottom surface 1906 of FIG. 19 and the conductive plating 1510, and peripheral of top surface of the substrate 1902.

The protection layer 2002 covers the peripheral of the top surface of the substrate 1902, exposing the center area thereof. The through via caps 1508 on the narrower opens 1406 of FIG. 14 and the adjacent exposed LDS material top surfaces 1904 are exposed in the center area. A gap 2004 exists between the inner vertical edges of the protection layer 2002 and outer edges of the through via caps 1508. The conductive plating 1510 is buried in the protection layer 2002.

The center of the through via caps 1508 on the wider opens 1404 of FIG. 14 are exposed from the protection layer 2002, while the edges of the through via caps 1508 are covered by the protection layer 2002.

The through vias 1506 and the through via caps 1508 are coupled with each other to provide electrical paths connecting top and bottom surfaces of the substrate 1902. The conductive plating 1510 are protected and isolated by the protection layer 2002 from damages.

Figure 21:
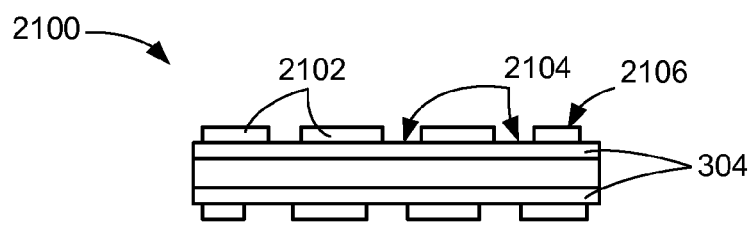
FIG. 21 is the structure of FIG. 3 after first metal layer patterning phase of manufacture of an integrated circuit packaging system in a fifth embodiment of the invention.

Referring now to FIG. 21, therein is shown the structure of FIG. 3 after a first metal layer patterning phase of manufacture of an integrated circuit packaging system 2100 in a fifth embodiment of the invention. During this process, first conductive plating 2102, such as copper plating, is patterned and formed on the conductive foil 304 in a plating process. The first conductive plating 2102 can be form of conductive metals, alloys, or combination thereof.

A photo resist layer (not shown), such as dry film which, is patterned to cover some of the surfaces of the conductive foil 304. Conductive materials are deposited on the uncovered surfaces of the conductive foil 304 for forming the first conductive plating 2102. After the first conductive plating 2102 is formed, the photo resist layer is removed to expose the conductive foil surfaces 2104. The first conductive plating 2102 has a conductive plating surface 2106.

Figure 22:
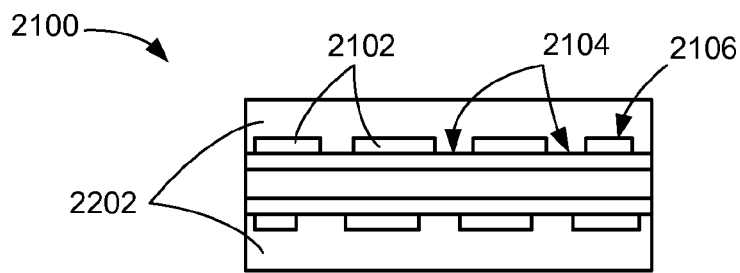
FIG. 22 is the structure of FIG. 21 after molding process phase of manufacture.

Referring now to FIG. 22, therein is shown the structure of FIG. 21 after molding process phase of manufacture. This structure shows a LDS material 2202 is formed covering the first conductive plating 2102, such as copper or copper alloy, and the exposed conductive foil surfaces 2104 in the molding process. The LDS material 2202 directly contacts the conductive plating surfaces 2106 and the exposed conductive foil surfaces 2104. The first conductive plating 2102 are embedded in the LDS material 2202. The top and side surfaces of the first conductive plating 2102 are completely embedded in the LDS material 2202.

Figure 23:
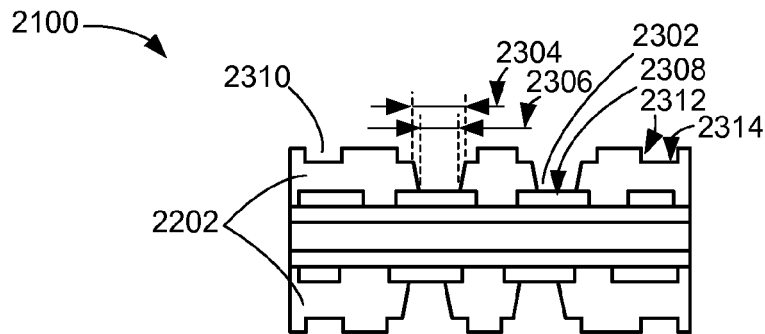
FIG. 23 is the structure of FIG. 22 after via drilling and plating process phase of manufacture.

Referring now to FIG. 23, therein is shown the structure of FIG. 22 after via drilling and plating process phase of manufacture. In a laser drill process, the LDS material 2202 is drilled through to form a plurality of through holes 2302.

The through holes 2302 can have wider opens 2304 and narrower opens 2306. Exposed plating surfaces 2308 are exposed in the narrower opens 2306. Sloping side walls of the through holes 2302 are extended from the exposed plating surfaces 2308 toward the wider opens 2304. Plurality of traces 2310 are patterned in top surface of the LDS material 2202 with various dimensions and shapes.

Some of the traces 2310 are patterned in the top surface of the LDS material 2202, having vertical sidewalls 2312 and flat bottoms 2314 directly contacting the LDS material 2202, wherein the flat bottoms 2314 are higher than the exposed plating surfaces 2308. Some of the traces 1410 are patterned on top of the through holes 2302, wherein the flat bottoms 2314 are extended between the wider opens 2304 and the vertical sidewalls 2312.

Figure 24:
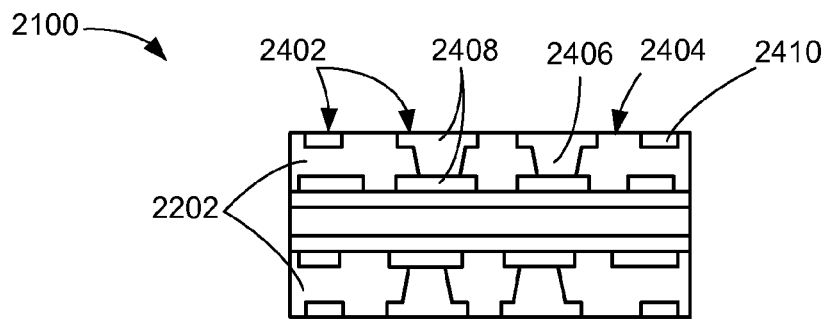
FIG. 24 is the structure of FIG. 23 after second metal layer patterning process phase of manufacture.

Referring now to FIG. 24, therein is shown the structure of FIG. 23 after a second metal layer patterning process phase of manufacture. Conductive materials, such as copper or alloy thereof, are filled into the through holes 2302 and traces 2310 of FIG. 23 to form a via and second conductive layer respectively. The second conductive layer top surfaces 2402 are aligned with LDS material top surfaces 2404. Through vias 2406 are defined as the conductive via between the wider opens 2304 and narrower opens 2306 of FIG. 23. Through via caps 2408 can include the second conductive layer covering the wider opens 2304, shaped by the vertical sidewalls 2312 and the flat bottoms 2314 of FIG. 23. The second conductive layer top surfaces 2402 is coplanar with the exposed plating surfaces 2308 of FIG. 23.

The through via caps 2408 can be directly on the through via wider opens 2304 and narrower opens 2306, having perimeters greater than the wider opens 2304 and narrower opens 2306. The through via caps 2408 are centered with the wider opens 2304 and narrower opens 2306 to provide a secured connection.

Conductive plating 2410 can be defined as the second conductive layer embedded in the LDS material 2202, having the vertical sidewalls 2312 and the flat bottoms 2314 of FIG. 23 directly contacted with the LDS material 2202 but not with the through vias 2406.

Figure 25:
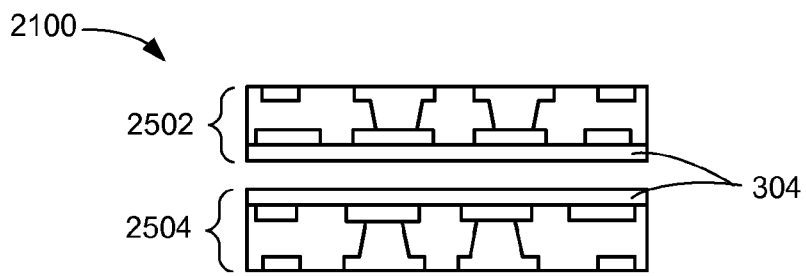
FIG. 25 is the structure of FIG. 24 after the detaching process phase of manufacture.

Referring now to FIG. 25, therein is shown the structure of FIG. 24 after the detaching process phase of manufacture. In the detaching process, the detach core 302 of FIG. 3 is removed. A top structure 2502 and bottom structure 2504 are separated as individual structures.

Figure 26:
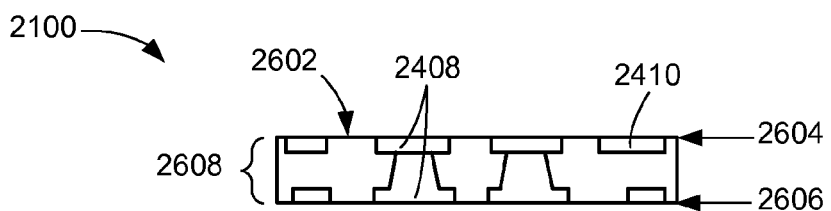
FIG. 26 is the bottom structure of FIG. 25 after conductive foil etching phase of manufacture.

Referring now to FIG. 26, therein is shown the bottom structure 2504 of FIG. 25 after conductive foil etching phase of manufacture. The conductive foil 304 of FIG. 25 is etched off from the bottom structure 2504 of FIG. 25. LDS material surfaces 2602, the through via caps 2408 and conductive plating 2410 on a top substrate surface 2604 and bottom substrate surface 2606 of a substrate 2608 are exposed.

Figure 27:
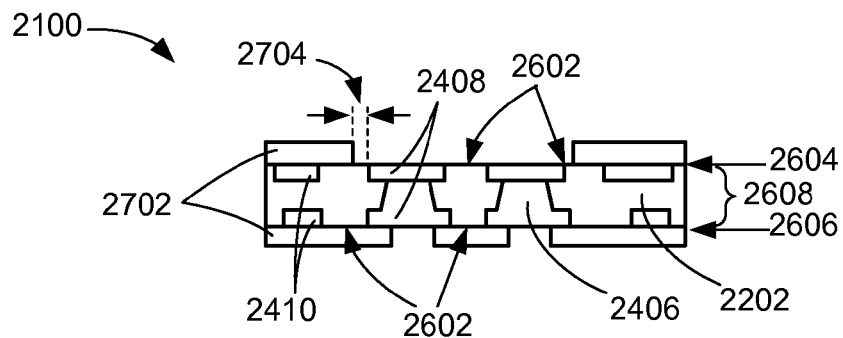
FIG. 27 is the structure of FIG. 26 after protection layer depositing process phase of manufacture.

Referring now to FIG. 27, therein is shown the structure of FIG. 26 after protection layer depositing process phase of manufacture. A protection layer 2702, such as solder resist, is deposited on the top substrate surface 2604 and bottom substrate surface 2606 of the substrate 2608 of FIG. 26. The protection layer 2702 covers the exposed LDS material surfaces 2602, and peripheral of the top substrate surface 2604.

The protection layer 2702 covers the peripheral of the top substrate surface 2604, exposing a center area thereof. The through via caps 2408 on the narrower opens 2306 of FIG. 23 and the adjacent LDS material surfaces 2602 are exposed in the center area. A gap 2704 exists between the inner vertical edges of the protection layer 2702 and the outer edges of the through via caps 2408. The conductive plating 2410 on the top substrate surface 2604 is buried under the protection layer 2702 and embedded in the LDS material 2202.

The center of the through via caps 2408 on the wider opens 2304 of FIG. 23 are exposed from the protection layer 2702, while edges of the through via caps 2408 are covered by the protection layer 2702. The LDS material surfaces 2602 and the conductive plating 2410 at bottom substrate surface 2606 are embedded in the protection layer 2702.

The through vias 2406 and the through via caps 2408 are coupled to provide electrical paths connecting top and bottom surfaces of the substrate 2608. The patterned LDS material 2202 provides insulation around the through via caps 2408 and the conductive plating 2410. The conductive plating 2410 are protected and isolated by the protection layer 2702 from damages.

Figure 28:
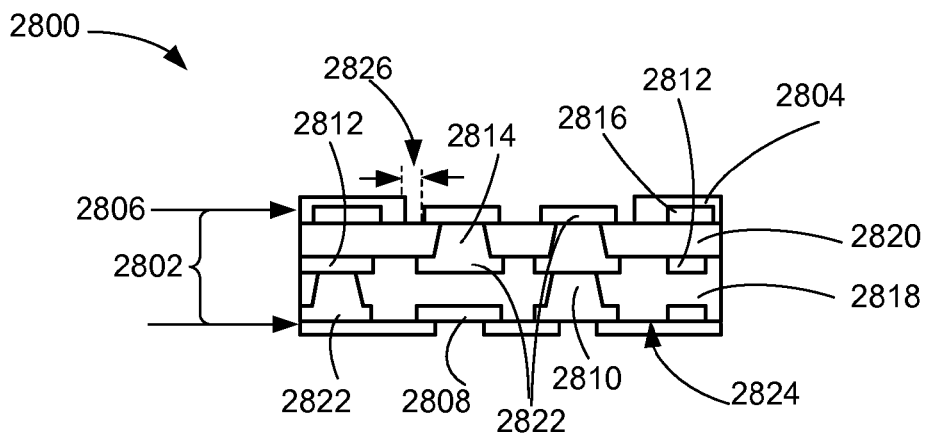
FIG. 28 is a cross section view of an integrated circuit packaging system in a sixth embodiment of the present invention.

Referring now to FIG. 28, therein is a cross section view of an integrated circuit packaging system 2800 in a sixth embodiment of the present invention. A coreless ETS and MIS multi-layer substrate 2802 includes a protection layer 2804, a top substrate surface 2806, a first conductive plating 2808, a first through via 2810, a second conductive plating 2812, a second through via 2814, a third conductive plating 2816, a first molding 2818, and a second molding 2820.

The first molding 2818 and second molding 2820 can be molding material including EMC. The first conductive plating 2808, the second conductive plating 2812, the third conductive plating 2816, the first through via 2810, and the second through via 2814 can be conductive metal or alloy thereof, such as copper or copper alloy. The protection layer 2804 can be dielectric material including solder resist. Preferably, the first conductive plating 2808, the second conductive plating 2812 and the third conductive plating 2816 are formed with same conductive materials to reduce resistant.

The portion of the conductive layers, including the first conductive plating 2808, the second conductive plating 2812, and the third conductive plating 2816, attached to the through vias, including the first through vias 2810 and second through vias 2814, are defined as through via caps 2822. The through via caps 2822 are centered with the through vias and extended over the edge of the through vias The first through vias 2810 are embedded in and pass through the first molding 2818. The first conductive plating 2808 is patterned and embedded in a bottom surface of the first molding 2818 and attached to the first through vias 2810. The protection layer 2804 is formed on an exposed first molding bottom surface 2824 and a peripheral of the bottom surface of the first molding 2818. Some of the first conductive plating 2808 have centers thereof exposed and edges embedded. The second conductive plating 2812 is patterned in a top surface of the first molding 2818.

The second molding 2820 is on top of the second conductive plating 2812 and the first molding 2818. The third conductive plating 2816 is formed on a top surface of the second molding 2820. The second through vias 2814 are embedded in the second molding 2820 with the through via caps 2822 on both ends thereof.

The protection layer 2804 covers peripheral of the top substrate surface 2806, exposing a center cavity. A portion of the third conductive plating 2816 are exposed in the center cavity, while other portions of the third conductive plating 2816 are embedded by the protection layer 2804. A margin 2826 exists between vertical inner walls of the protection layer 2804 and the edge of the third conductive plating 2816 exposed in the center cavity and adjacent to the protection layer 2804.

Narrower ends of the first through via 2810 are coupled with wider ends of the second through via 2814. It has been discovered that coupling a narrower end of the through via with a wider end of another through via, can secure electrical connections to overcome an alignment problem occurs in the manufacturing processes. This can improve the reliability of the packaging system. The combination of LDS material and EMC further reduces the cost of the substrate manufacturing by a lower cost EMC material and a simplified LDS material manufacturing process.

Figure 29:
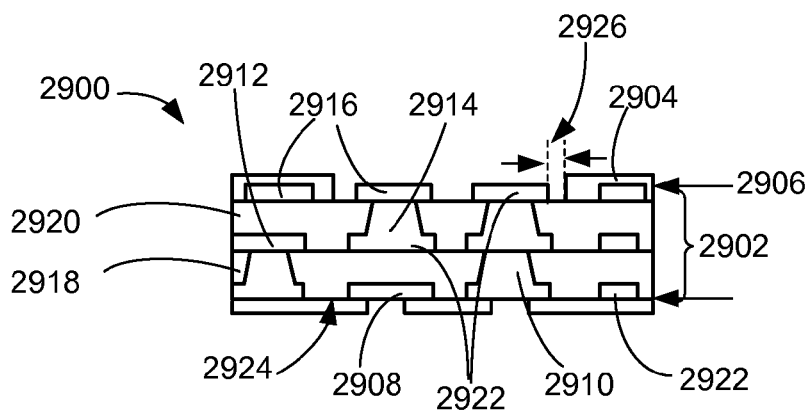
FIG. 29 is a cross section view of an integrated circuit packaging system in a seventh embodiment of the present invention.

Referring now to FIG. 29, therein is cross section view of an integrated circuit packaging system 2900 in a seventh embodiment of the present invention. A coreless ETS and MIS multi-layer substrate 2902 includes a protection layer 2904, a top substrate surface 2906, a first conductive plating 2908, a first through via 2910, a second conductive plating 2912, a second through via 2914, a third conductive plating 2916, a first molding 2918, and a second molding 2920.

The first molding 2918 and second molding 2920 can be molding material including EMC. The first conductive plating 2908, the second conductive plating 2912, the third conductive plating 2916, the first through via 2910, and the second through via 2914 can be conductive metal or alloy thereof, such as copper or copper alloy. The protection layer 2904 can be dielectric material including solder resist. Preferably, the first conductive plating 2808, the second conductive plating 2812 and the third conductive plating 2816 are formed with same conductive materials to reduce resistant.

The portion of the conductive layers, including the first conductive plating 2908, the second conductive plating 2912, and the third conductive plating 2916, attached to the through vias, including the first through vias 2910 and second through vias 2914, are defined as through via caps 2922. The through via caps 2922 are centered with the through vias and extended over the edge of the through vias.

The first through vias 2910 are embedded in and pass through the first molding 2918. The first conductive plating 2908 is patterned and embedded to a bottom surface of the first molding 2918 and attached to the first through vias 2910. The protection layer 2904 is formed on an exposed first molding bottom surface 2924 and a peripheral of the bottom surface of the first molding 2918. Some of the first conductive plating 2908 have centers thereof exposed and edges embedded.

The second conductive plating 2912 is patterned in top surface of the second molding 2920. The second molding 2920 is on top of the first through vias 2910 and the surface of the first molding 2918. The third conductive plating 2916 is formed on a top surface of the second molding 2920 and the second vias 2914. The second through vias 2914 are embedded in the second molding 2920 with the through via caps 2922 on both ends thereof.

The protection layer 2904 covers peripheral of the top substrate surface 2906, exposing a center cavity. A portion of the third conductive plating 2916 are exposed in the center cavity, while other portions of the third conductive plating 2916 are embedded by the protection layer 2904. A margin 2926 exists between vertical inner walls of the protection layer 2904 and the edge of the third conductive plating 2916 exposed in the center cavity and adjacent to the protection layer 2904.

Narrower ends of the first through via 2910 are coupled with wider ends of the second through via 2914. It has been discovered that coupling a narrower open of the through via with a wider open of another through via, can secure electrical connections to overcome an alignment problem occurs in the manufacturing processes. This can improve the reliability of the packaging system. By replacing EMC with LDS material can further reduce the cost of the substrate manufacturing by a simplified LDS material manufacturing process.

Figure 30:
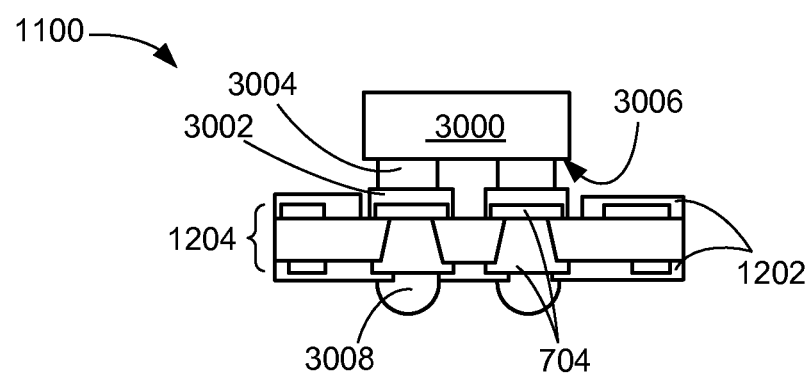
FIG. 30 is the structure of FIG. 12 having the integrated circuit mounted thereon.

Referring now to FIG. 30, therein is shown the structure of FIG. 12 having the integrated circuit 3000 mounted thereon. The integrated circuit 3000, such as a flip chip, is mounted over the exposed center area of the substrate 1204. The through via caps 704 are connected with the integrated circuit 3000 through conductive pads 3002 and bumps 3004.

An active side 3006 of the integrated circuit 3000 is higher than the top surface of the protection layer 1202 and faces the substrate 1204. The top surfaces of the conductive pads 3002 are higher than the top surface of the protection layer 1202. The through via caps 704 are embedded in the conductive pads 3002 completely, with a top and side surfaces covered by the conductive pads 3002. The A gap exists between the vertical inner sidewalls of the protection layer 1202 and the vertical outer sidewalls of the conductive pads 3002. The bumps 3004 are connected to the active side 3006 and the conductive pads 3002. The dimension of the bumps 3004 is smaller the conductive pads 3002.

The centers of the exposed through via caps 704 at bottom of the substrate 1204 are attached with external connectors 3008, such as solder balls. The external connectors 3008 are embedded in the protection layer 1202. The edges of the protection layer 1202 are buried under the external connectors 3008. No through via caps 704 are exposed at bottom surface of the substrate 1204.

It has been discovered that, by mounting the integrated circuit on the narrower end of the through via, the integrated circuit packaging system can be configured to accommodate more connectors and enable fine pitches of the integrated circuit. Bump bridging issue can be avoided in the coreless ETS and MIS substrate.

Figure 31:
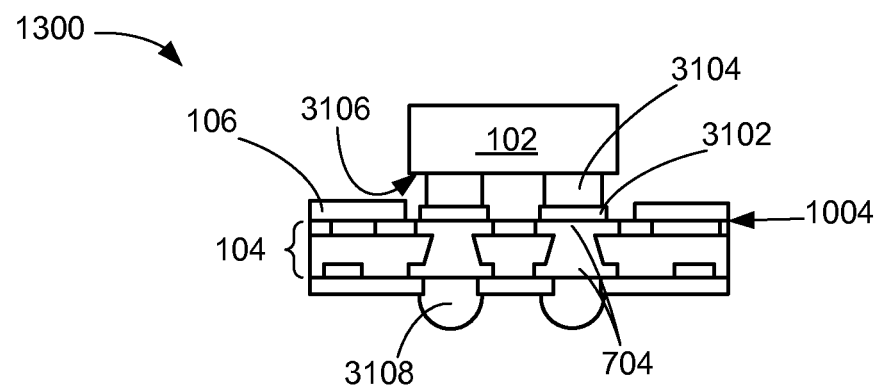
FIG. 31 is the structure of FIG. 10 having the integrated circuit mounted thereon.

Referring now to FIG. 31, therein is shown the structure of FIG. 10 having the device 102 mounted thereon. The device 102, such as a flip chip, is mounted over the exposed center area of the substrate 104. The through via caps 704 are connected with the device 102 through conductive pads 3102 and bumps 3104.

An active surface 3106 of the device 102 is higher than the top surface of the protection layer 106. The through via caps 704 is connected to the conductive pads 3002. A gap exists between the vertical inner sidewalls of the protection layer 106 and the vertical sidewalls of the conductive pads 3102 and bumps 3104. Photo resist surfaces are exposed in the gap isolating the conductive pad 3102 and bumps 3104 from the protection layer 106. The dimension of the conductive pads 3102 is smaller than the through via caps 704, but greater than the bump 3104. The contacting surfaces of the bumps 3104 and conductive pads 3102 are lower than the top surface of the protection layer 106. Rims of the through via caps 704 on top of the substrate 104 are exposed, while the center of the through via caps 704 are under the conductive pads 3102 and electrically connected thereto.

The centers of the exposed through via caps 704 at the bottom surface of the substrate 104 are attached with external connectors 3108, such as solder balls. The edges of the protection layer 106 are buried in the external connectors 3108. No through via caps 704 are exposed at the bottom surface of the substrate 104.

It has been discovered that, by mounting the integrated circuit on the narrower end of the through via, the integrated circuit packaging system can be configured to accommodate more connectors and enable fine pitches of the integrated circuit. Bump bridging issue can be avoided in the coreless ETS and MIS substrate.

Figure 32:
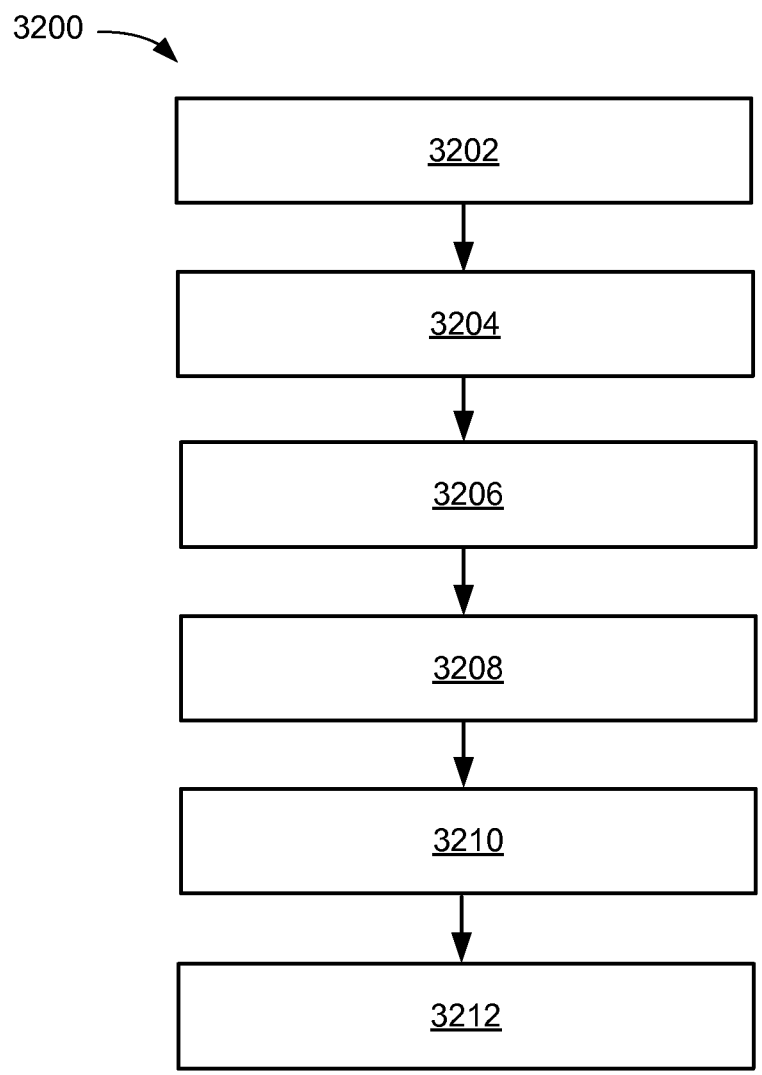
FIG. 32 is a flow chart of a method of manufacturing of an integrated circuit packaging system in a further embodiment of the present invention.

Referring now to FIG. 32, therein is shown a flow chart of a method 3200 of manufacture of an integrated circuit packaging system in a further embodiment of the present invention. The method 3200 includes: forming a patterned first conductive plating (206) in a block 3202; forming a molding (202) on the patterned first conductive plating (206) in a block 3204; forming a through via (210) through the molding (202) in a block 3206; forming a second conductive plating (208) on the molding (202) and the through via (210) in a block 3208; forming a protection layer (106) partially covering the first conductive plating (206), the second conductive plating (208) and the molding (202) in a block 3210; and mounting a device (102) on the first conductive plating (206) in a block 3212.

It has been discovered that embodiments of this invention provide a low cost substrate structure by using an EMC. These materials replace costly conventional materials, such as core and polytetraflurorethylene pre-impregnated (PPG). The process is simplified by omitting certain steps in the manufacturing process and a dual process can improve the productivity. The coreless ETS substrate combined with MIS can also avoid bump bridge problem, and enable fine pitch of the integrated circuit mounting.

It has been discovered that embodiments of this invention have advantages of having dual process, no need of copper reduction during seed layer etching process to enable fine pitches, no need of special materials. The embodiments of this invention have simplified manufacturing process, which includes molding, via drilling, forming patterns and metal plating. This manufacturing process is faster than conventional process to shrink production cycle. The process needs to plate for patterning only once instead of repeating multiple times to reduce the patterning cost and time. Since laser patterning is cheaper than dry film lamination and plating, this can further reduces cost and time of production.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems, fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a first conductive plating, wherein the first conductive plating is patterned;
   forming a first molding on the first conductive plating, wherein the first molding includes an Epoxy Mold Compound (EMC) and a Laser Direct the LSD material Structuring (LDS) material, the LSD material includes a metalorganic in a polymer thereof;
   forming a first through via through the first molding;
   forming a second conductive plating on the first molding and the first through via, wherein the second conductive plating is patterned;
   forming a first protection layer partially covering the first conductive plating and the first molding, the first conductive plating is isolated by an empty space, a photo resist, the first protection layer, or the first molding;
   forming a second protection layer partially covering the second conductive plating and the first molding, the second conductive plating is isolated by the empty space, the first molding, or the second protection layer;
   mounting a device over the first conductive plating; and
   attaching an external connector to the second conductive plating.

2. The method as claimed in claim 1 wherein:
   forming the first protection layer includes forming the first protection layer with a surface higher than that of the first conductive plating; and
   forming the second protection layer includes forming the second protection layer with a surface higher than that of the second conductive plating.

3. The method as claimed in claim 1 wherein:
   forming the first conductive plating includes forming the first conductive plating wider than a narrow end of the first through via; and forming the second conductive plating includes forming the second conductive plating wider than a wide end of the first through via.

4. The method as claimed in claim 1 further comprising:
forming the first conductive plating on a narrow end of the first through via; and
forming the second conductive plating on a wide end of the first through via.

5. The method as claimed in claim 1 wherein:
attaching the external connector includes electrically coupling the external connector with the first through via and the device.

6. A method of manufacture of an integrated circuit packaging system comprising:
forming a first conductive plating, wherein the first conductive plating is patterned;
forming a first molding on the first conductive plating, wherein the first molding includes an Epoxy Mold Compound (EMC) and a Laser Direct Structuring (LDS) material, the LSD material includes a metalorganic in a polymer thereof;
forming a first through via through the first molding by laser drilling and plating, wherein the first through via are electrically coupled with the first conductive plating;
forming a second conductive plating on the first molding and the first through via, wherein the second conductive plating is patterned;
forming a first protection layer partially covering the first conductive plating, and the first molding, the first conductive plating is isolated by an empty space, a photo resist, the first protection layer, or the first molding;
forming a second protection layer partially covering the second conductive plating and the first molding, the second conductive plating is electrically coupled with the first through via, the second conductive plating is isolated by the empty space, the second protection layer, or the first molding; and
mounting a device over the first conductive plating and an external connector on the second conductive plating.

7. The method as claimed in claim 6 further comprising:
exposing a center of a through via cap from the first protection layer and the second protection layer.

8. The method as claimed in claim 6 further comprising:
forming a second molding on the second conductive plating and the first molding, wherein the second conductive plating is isolated by the second molding;
forming a second through via through the second molding;
forming a third conductive plating on the second through via and the second molding;
forming the first protection layer partially covering the first conductive plating, and the first molding;
forming the second protection layer partially covering the third conductive plating, and the second molding, wherein the first through via and the second through via are electrically coupled through a through via cap; and
mounting the device over the third conductive plating.

9. The method as claimed in claim 6 further comprising:
isolating the second conductive plating by the first molding, the second molding, or the second protection layer; and
isolating a third conductive plating by an empty space, a photo resist, the second protection layer, or the second molding.

10. The method as claimed in claim 6 further comprising:
forming a second molding on the second conductive plating;
forming a second through via through the second molding;
forming a third conductive plating on the second through via and the second molding;
forming the second protection layer partially covering the third conductive plating and the second molding, wherein the first through via and the second through via are electrically coupled through a through via cap; and
mounting the device over the third conductive plating.

11. An integrated circuit packaging system comprising:
a first conductive plating, wherein the first conductive plating is patterned;
a first molding on the first conductive plating, wherein the first molding includes an Epoxy Mold Compound (EMC) and a Laser Direct Structuring (LSD) material, the LSD material includes a metalorganic in a polymer thereof;
a first through via through the first molding;
a second conductive plating on the first molding and the first through via, wherein the second conductive plating is patterned;
a first protection layer partially covering the first conductive plating and the first molding, the first conductive plating is isolated by an empty space, a photo resist, the first protection layer, or the first molding;
a second protection layer partially covering the second conductive plating and the first molding, the second conductive plating is isolated by the empty space, the second protection layer, or the first molding;
a device mounted over the first conductive plating; and
an external connector being attached to the second conductive plating.

12. The system as claimed in claim 11 wherein:
the first protection layer includes a surface higher than that of the first conductive plating; and
the second protection layer includes a surface higher than that of the second conductive plating.

13. The system as claimed in claim 11 wherein:
the first conductive plating is wider than a narrow end of the first through via; and
the second conductive plating is wider than a wide end of the first through via.

14. The system as claimed in claim 11 further comprising:
the first conductive plating is on a narrow end of the first through via; and
the second conductive plating is on a wide end of the first through via.

15. The system as claimed in claim 11 wherein the external connector is electrically coupled with the first through via and the device.

16. The system as claimed in claim 11 further comprising:
the first through via being formed by laser drilling and plating, wherein the first through via is electrically coupled with the first conductive plating and the second conductive plating.

17. The system as claimed in claim 16 further comprising:
the first protection layer partially covering the first conductive plating, the photo resist, and the first molding; and
a center of a through via cap being exposed from the first protection layer and the second protection layer.

18. The system as claimed in claim 16 further comprising:
a second molding on the second conductive plating and the first molding, wherein the second conductive plating is isolated by the second molding;
a second through via through the second molding;
a third conductive plating on the second through via and the second molding;
the second protection layer partially covering the third conductive plating, and the second molding; and the first through via and the second through via are electrically coupled through a through via cap.

19. The system as claimed in claim 16 wherein the device is mounted over a third conductive plating.

20. The system as claimed in claim 16 further comprising:
a second molding on a second conductive plating;
a second through via through the second molding;
a third conductive plating on the second through via and the second molding;
the second protection layer partially covering the third conductive plating and the second molding; and
the first through via and the second through via are electrically coupled through a through via cap.

* * * * *

UNITED STATES PATENT AND TRADEMARK OFFICE
CERTIFICATE OF CORRECTION

PATENT NO. : 9,171,739 B1  Page 1 of 1
APPLICATION NO. : 14/313452
DATED : October 27, 2015
INVENTOR(S) : Roh et al.

It is certified that error appears in the above-identified patent and that said Letters Patent is hereby corrected as shown below:

In the Claims:

1. Column 16, Claim 1, line 39, delete "and a Laser Direct the LSD material Structuring (LDS) material, the LSD material includes" and insert therefor
   --and a Laser Direct Structuring (LDS) material, the LDS includes--

2. Column 17, Claim 6, line 20, delete "the LSD material includes" and insert therefor
   --the LDS includes--

3. Column 18, Claim 11, line 14, delete "the LSD material includes" and insert therefor
   --the LDS includes--

Signed and Sealed this
Twenty-ninth Day of March, 2016

Michelle K. Lee
*Director of the United States Patent and Trademark Office*